United States Patent
Jeong et al.

(10) Patent No.: US 10,903,287 B2
(45) Date of Patent: Jan. 26, 2021

(54) FOLDABLE, FLEXIBLE DISPLAY APPARATUS AND METHOD OF MANUFACTURING THE SAME

(71) Applicant: SAMSUNG DISPLAY CO., LTD., Yongin-si (KR)

(72) Inventors: Yong-Cheol Jeong, Yongin-si (KR);
Seung-Wook Nam, Yongin-si (KR);
So-Yeon Han, Yongin-si (KR);
Kyu-Young Kim, Yongin-si (KR);
Ah-Young Kim, Yongin-si (KR);
Gui-Nam Min, Yongin-si (KR);
Kyu-Taek Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/730,501

(22) Filed: Dec. 30, 2019

(65) Prior Publication Data
US 2020/0152709 A1    May 14, 2020

Related U.S. Application Data

(63) Continuation of application No. 16/127,192, filed on Sep. 10, 2018, now Pat. No. 10,522,599, which is a
(Continued)

(30) Foreign Application Priority Data

Jan. 23, 2014    (KR) ........................ 10-2014-0008506

(51) Int. Cl.
*H01L 27/32*    (2006.01)
*H01L 51/52*    (2006.01)
(Continued)

(52) U.S. Cl.
CPC .......... *H01L 27/323* (2013.01); *G06F 1/1626* (2013.01); *G06F 1/1643* (2013.01);
(Continued)

(58) Field of Classification Search
CPC ......... H01L 51/0097; H01L 2251/5338; H01L 51/5253; H01L 51/5256; H01L 27/323; H04M 1/0268; H04M 1/0214–0222
See application file for complete search history.

(56) References Cited

U.S. PATENT DOCUMENTS 8,344,396 B2    1/2013    Shim et al.
8,497,956 B2    7/2013    Jung et al.
(Continued)

FOREIGN PATENT DOCUMENTS

JP    2002-055225    2/2002
JP    2010-228391    10/2010
(Continued)

OTHER PUBLICATIONS

Kalinna, Gunter, "How accurate is the scratch hardness test? Pencils used as measuring devices", JOT International Surface Technology, Feb. 2010, pp. 2-3.
(Continued)

*Primary Examiner* — Scott B Geyer
(74) *Attorney, Agent, or Firm* — Lewis Roca Rothgerber Christie LLP

(57) ABSTRACT

A foldable, flexible display apparatus includes a flexible display panel which displays an image and includes a display side on which the image is displayed and of which portions thereof face each other in a folded state of the flexible display apparatus; a cover window on the display side of the flexible display panel and including: a window film comprising a transparent plastic film having a modulus of elasticity of about 6.3 gigapascals or more; and a coating
(Continued)

layer on the window film, and configured to be transparent and to protect the window film from physical damage thereto; and an adhesive layer between the window film and the display side of the flexible display panel, and configured to have elasticity and bond the window film and the flexible display panel to each other.

13 Claims, 7 Drawing Sheets

Related U.S. Application Data continuation of application No. 15/591,411, filed on May 10, 2017, now Pat. No. 10,074,701, which is a continuation of application No. 14/510,231, filed on Oct. 9, 2014, now Pat. No. 9,661,114.

(51) Int. Cl.
*G06F 1/16* (2006.01)
*G06F 3/041* (2006.01)
*G06F 3/044* (2006.01)
*H04M 1/02* (2006.01)
*H01L 51/00* (2006.01)

(52) U.S. Cl.
CPC ............ *G06F 1/1652* (2013.01); *G06F 3/044* (2013.01); *G06F 3/0412* (2013.01); *H01L 27/3276* (2013.01); *H01L 51/0097* (2013.01); *H01L 51/5256* (2013.01); *H04M 1/0268* (2013.01); *G06F 2203/04102* (2013.01); *G06F 2203/04103* (2013.01); *G06F 2203/04111* (2013.01); *H01L 27/3244* (2013.01); *H01L 51/5237* (2013.01); *H01L 2251/5338* (2013.01); *H04M 1/0214* (2013.01)

(56) References Cited

U.S. PATENT DOCUMENTS

| 9,051,493 | B2 | 6/2015 | Bower et al. |
| 9,661,114 | B2 | 5/2017 | Jeong et al. |
| 10,074,701 | B2 * | 9/2018 | Jeong .................. H01L 27/3276 |
| 10,522,599 | B2 * | 12/2019 | Jeong ..................... G06F 1/1652 |
| 2007/0122598 | A1 | 5/2007 | Coak et al. |
| 2008/0236905 | A1 | 10/2008 | Endo et al. |
| 2012/0242610 | A1 | 9/2012 | Yasumatsu |
| 2013/0083496 | A1 | 4/2013 | Franklin et al. |
| 2013/0222998 | A1 | 8/2013 | Cho et al. |

FOREIGN PATENT DOCUMENTS

| JP | 2013-045044 | | 3/2013 |
| KR | 10-2000-0021263 | | 4/2000 |
| KR | 10-2006-0114443 | | 11/2006 |
| KR | 10-2006-0115447 | | 11/2006 |
| KR | 10-2008-0055713 | | 6/2008 |
| KR | 10-2011-0034891 | A | 4/2011 |
| KR | 10-2011-0110593 | A | 10/2011 |
| KR | 10-2012-0015942 | A | 2/2012 |
| KR | 10-2013-0013881 | | 2/2013 |
| KR | 10-2013-0063322 | A | 6/2013 |
| KR | 10-2013-0074624 | | 7/2013 |

OTHER PUBLICATIONS

Final Office Action dated Sep. 23, 2016 in YPL1409US.
Final Office Action dated Nov. 9, 2015 in YPL1409US.
Non-Final Office Action dated Jun. 19, 2015 in YPL1409US.

* cited by examiner

FOLDABLE, FLEXIBLE DISPLAY APPARATUS AND METHOD OF MANUFACTURING THE SAME

CROSS-REFERENCE TO RELATED APPLICATIONS

This application is a continuation of U.S. patent application Ser. No. 16/127,192, filed Sep. 10, 2018, which is a continuation of U.S. patent application Ser. No. 15/591,411, filed May 10, 2017, now U.S. Pat. No. 10,074,701, which is a continuation of U.S. patent application Ser. No. 14/510,231, filed on Oct. 9, 2014, now U.S. Pat. No. 9,661,114, which claims priority to and the benefit of Korean Patent Application No. 10-2014-0008506, filed Jan. 23, 2014, the entire contents of all of which are incorporated herein by reference.

BACKGROUND

1. Field

One or more embodiment of the invention relates to a foldable, flexible display apparatus and a method of manufacturing the same.

2. Description of the Related Art

Organic light-emitting display apparatuses using an organic light-emitting device are widely accepted as a next generation display apparatus due to their relatively fast response speeds that enable the display of videos and their self light-emitting characteristics that provide wide viewing angles and high brightness in comparison to liquid crystal displays that are now widely commercially available.

Organic light-emitting display apparatuses have been developed to be bendable or furthermore foldable by a lower substrate and an encapsulation substrate including a flexible material.

SUMMARY

With respect to a flexible organic light-emitting display apparatuses, a window film disposed on an encapsulation substrate must be changed to a material or a thickness which is bendable or furthermore foldable. Also, a display surface of the flexible organic light-emitting display apparatuses may be protected from external damage, regardless of bending or folding function of the flexible organic light-emitting display apparatus.

One or more embodiment of the invention includes a foldable, flexible display apparatus and a method of manufacturing the same.

Additional features will be set forth in part in the description which follows and, in part, will be apparent from the description, or may be learned by practice of the presented embodiments.

According to one or more embodiment of the invention, a foldable, flexible display apparatus includes: a flexible display panel which displays an image, and includes a display side on which the image is displayed and of which portions thereof face each other in a folded state of the flexible display apparatus; a cover window on the display side of the flexible display panel and including: a window film including a transparent plastic film having a modulus of elasticity of about 6.3 gigapascals or more; and a coating layer on the window film, and configured to be transparent and to protect the window film from physical damage thereto; and an adhesive layer between the window film and the display side of the flexible display panel, and configured to have elasticity and bond the window film and the flexible display panel to each other.

The window film may include transparent polyethylene terephthalate, polymethylmethacrylate, polycarbonate or polyimide.

The coating layer may include a hybrimer.

The coating layer may include a siloxane-polymer hybrid which is a product of a condensation reaction of an organoalkoxysilane and an organosilanediol.

A sum of thicknesses of the window film and the coating layer may be about 120 micrometers ($\mu m$) or more.

The thickness of the coating layer may be about 45% or more of the sum of the thicknesses of the window film and the coating layer.

The flexible display panel may include: a thin film transistor on a foldable substrate; an insulating layer covering the thin film transistor; an organic light-emitting diode which is on the insulating layer, is electrically connected to the thin film transistor and is configured to emit light, and includes an organic emission layer between two electrodes; and an encapsulation layer on the substrate and configured to encapsulate the organic light-emitting diode.

The foldable, flexible display apparatus may further include: a flexible touch screen panel which is bonded to the encapsulation layer, and is configured to sense a touch input from the coating layer of the cover window; and an optical film which is bonded to the touch screen panel and configured to prevent reflection of external light.

According to one or more embodiment of the invention, a method of manufacturing a foldable, flexible display apparatus includes: preparing a flexible display panel which displays an image and includes a display side on which the image is displayed and of which portions thereof face each other in a folded state of the flexible display apparatus; preparing a window film of a window cover of the foldable, flexible display apparatus, the window film including a transparent plastic film having a modulus of elasticity of about 6.3 gigapascals (GPa) or more; forming a coating layer of the window cover of the foldable, flexible display apparatus, on the window film, the coating layer configured to be transparent and protect the window film from physical damage; and bonding the window film and the flexible display panel by disposing an adhesive layer having elasticity between the window film and the display side of the flexible display panel.

The forming the coating layer may include: coating a mixed solution of an oligosiloxane hybrid and a volatile solvent on the window film, and drying the coated mixed solution to remove the volatile solvent; and curing the coated and dried mixed solution using ultraviolet light, to form a siloxane-polymer hybrid.

The foregoing and other features and advantages of the invention will be made more apparent from the detailed description, drawings and claims that follow.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
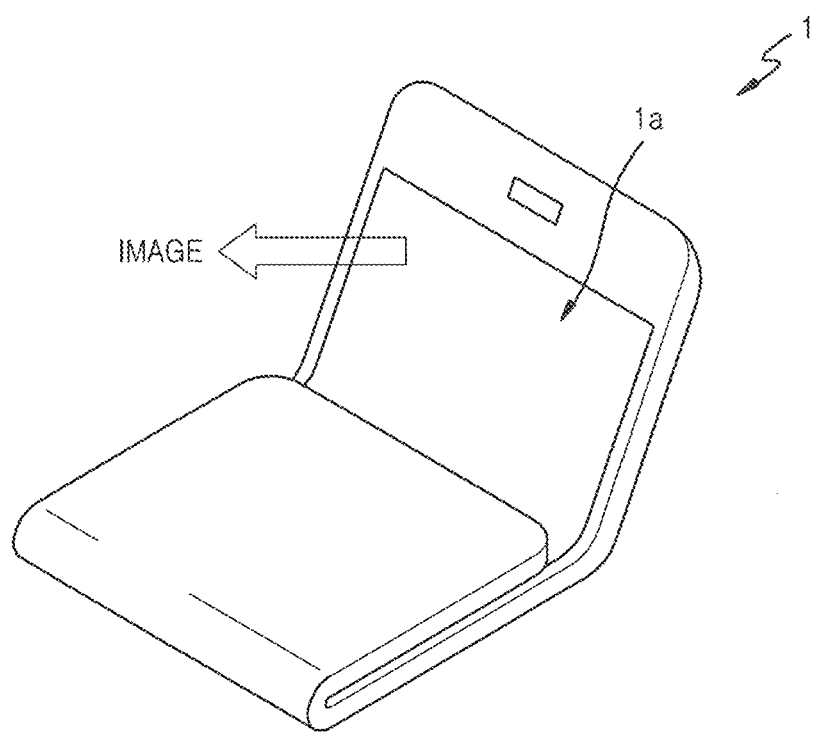
FIG. 1 is a schematic perspective view illustrating an embodiment of a foldable, flexible display apparatus according to the invention.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the figures, to explain features of the invention.

While the invention is amenable to various modifications and alternative forms, specific embodiments have been shown by way of example in the drawings and are described in detail below. Effects and features of the invention, and implementation methods thereof will be clarified through following embodiments described with reference to the accompanying drawings. The invention may, however, be embodied in different forms and should not be construed as limited to the embodiments set forth herein.

Hereinafter, embodiments of the invention will be described in detail with reference to the accompanying drawings. Like reference numerals in the drawings denote like elements, and thus their description will be omitted.

As used herein, the term "and/or" includes any and all combinations of one or more of the associated listed items. Expressions such as "at least one of," when preceding a list of elements, modify the entire list of elements and do not modify the individual elements of the list.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "above" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

FIG. 1 is a schematic perspective view illustrating an embodiment of a foldable, flexible display apparatus 1 according to the invention.

Referring to FIG. 1, the flexible display apparatus 1 may have properties in which it is bendable or furthermore foldable, in addition to having bendable and flexible properties. According to the above properties, since the volume of the flexible display apparatus 1 may be reduced by folding the flexible display apparatus 1 such as for storage, the storage may be facilitated. When using the flexible display apparatus 1, a user may easily use the flexible display apparatus 1 by unfolding it.

As illustrated in FIG. 1, the flexible display apparatus 1 may include a side 1a on which an image is displayed as indicated by IMAGE, where the side 1a may be folded such that portions thereof face each other in a folded state of the flexible display apparatus 1. FIG. 1 illustrates that the flexible display apparatus 1 is folded once at a first folding axis. However, the invention is not limited thereto and may include the flexible display apparatus 1 that may be folded twice at two different folding axes or more. Also, a folding direction or folding form of the flexible display apparatus 1 is not limited to that illustrated in FIG. 1 and may be variously realized.

Figure 2:
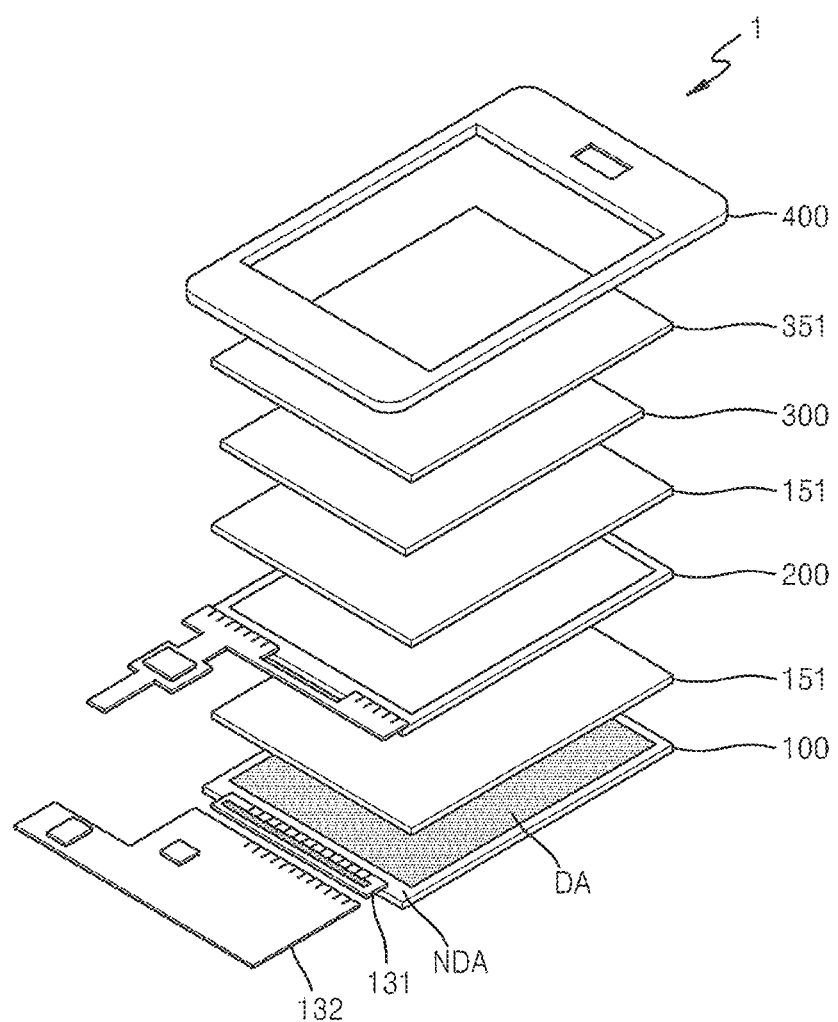
FIG. 2 is an exploded perspective view illustrating an embodiment of a stacked structure of the flexible display apparatus of FIG. 1.

FIG. 2 is a schematic perspective view illustrating an embodiment of a stacked structure of the flexible display apparatus 1 of FIG. 1.

Referring to FIG. 2, the flexible display apparatus 1 sequentially includes a flexible display panel 100, a touch screen panel 200, an optical film 300 and a cover window 400 from the bottom side to a front side on which a user views an image.

The flexible display panel 100, as a kind of a display which displays an image, may have flexible and foldable properties. One side of the flexible display panel 100 includes a display area DA which emits an image. A plurality of pixels is disposed on the display area DA, and since each pixel emits light, the entire display area DA may realize a predetermined image. The display area DA will be described in more detail with reference to FIG. 3.

A non-display area NDA is disposed around the display area DA. A plurality of pads (not shown) is disposed in the non-display area NDA and the plurality of pads is connected to wirings (not shown) extending from the display area DA. Chips such as integrated chips ("ICs") for applying various signals to the display area DA may be disposed on the plurality of pads. The chips may be disposed by using a chip on film ("COF") method as illustrated in FIG. 2, in which a bare chip is connected by being mounted on a flexible substrate 131. A wiring board 132 may be further included to supply various powers to the chips. The wiring board 132 may be electrically connected to the chips and, for example, may be a flexible printed circuit board ("FPCB"). The FPCB may electrically connect other components included in the flexible display apparatus 1, for example, the touch screen panel 200 and/or the flexible display panel 100.

Figure 3:
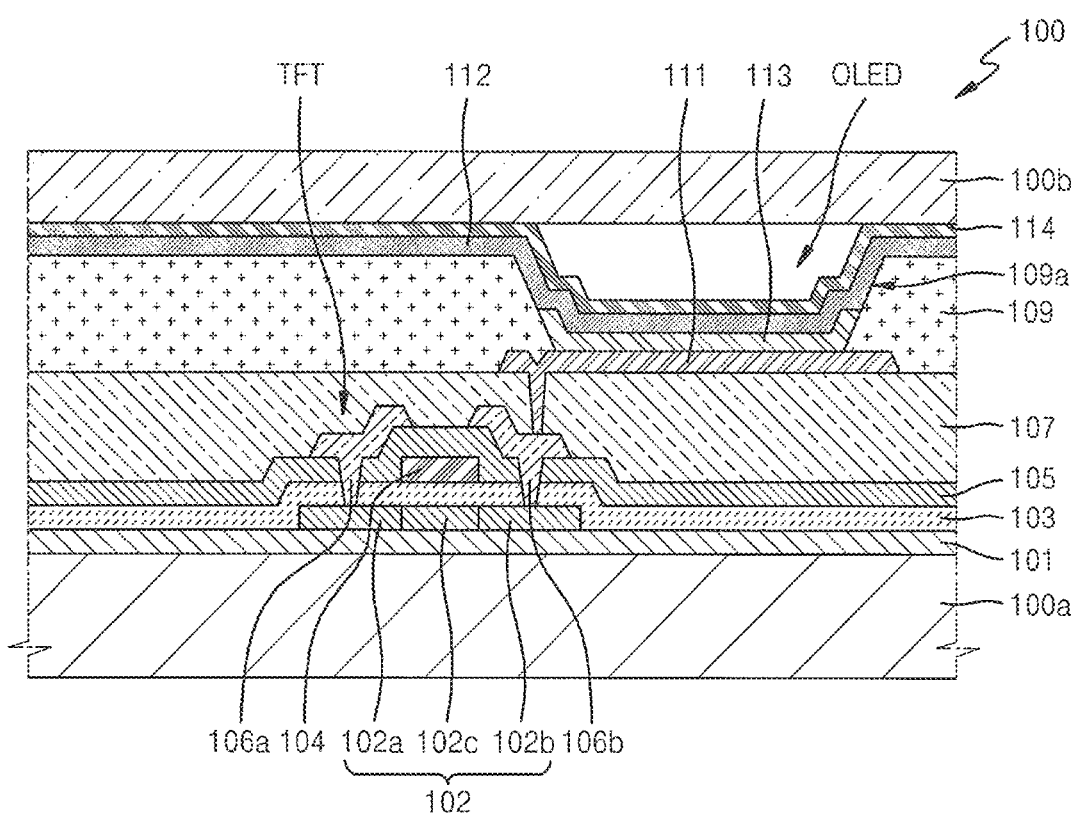
FIG. 3 is a schematic cross-sectional view illustrating an embodiment of a display area of a flexible display panel included in FIG. 2.

FIG. 3 is a schematic cross-sectional view illustrating an embodiment of a display area of a flexible display panel included in FIG. 2. A specific configuration and a manufacturing method of the display area DA will be described with reference to FIG. 3.

First, a flexible display substrate 100a is prepared. The flexible display substrate 100a may include a flexible material that is bendable or foldable. In an embodiment, for example, the flexible display substrate 100a may be formed of a plastic film, such as a polyimide film, or may be formed of a thin plate glass or a thin metal film.

A buffer layer 101 is disposed on the flexible display substrate 100a. The buffer layer 101 planarizes a top surface of the substrate 100a and blocks the penetration of impurities. The buffer layer 101 may have a single layer structure or a multiple layer structure including a layer of an inorganic material such as silicon oxide ($SiO_x$) and/or silicon nitride ($SiN_x$). The buffer layer 101 may be formed by various deposition methods in the manufacturing method of the display area DA. In another embodiment, the buffer layer 101 may be omitted.

A pixel circuit unit is disposed on the buffer layer 101. The pixel circuit unit includes at least one thin film transistor ("TFT"). However, an embodiment of the invention is not limited thereto and the pixel circuit unit may further include at least one capacitor. In FIG. 3, only a single TFT corresponding to a single pixel is illustrated for convenience of explanation. However, in an alternative embodiment, a pixel circuit corresponding to a single pixel may include at least two TFTs and at least one capacitor. Also, FIG. 3 illustrates a top-gate type TFT sequentially including an active layer 102, a gate electrode 104 and source and drain electrodes 106a and 106b on the flexible display substrate 100a. However, the invention is not limited thereto, and various types, such as a bottom-gate type, of TFTs may be used.

The active layer 102 is disposed on the buffer layer 101. The active layer 102 may include a semiconductor material and for example, may include amorphous silicon or polycrystalline silicon. However, the invention is not limited thereto. The active layer 102, for example, may include an oxide semiconductor material such as indium gallium zinc oxide $((In_2O_3)_a(Ga_2O_3)_b(ZnO)_c$, "IGZO") (where a, b, and c are real numbers respectively satisfying conditions of $a \geq 0$, $b \geq 0$, and $c > 0$). In addition to the IGZO, the active layer 102 may include an oxide of a material selected from Groups 12, 13, and 14 metallic elements, such as zinc (Zn), indium (In), gallium (Ga), tin (Sn), cadmium (Cd), germanium (Ge), or hafnium (Hf) and a combination thereof.

The active layer 102 includes a source region 102a and a drain region 102b, which are respectively in contact with the source electrode 106a and the drain electrode 106b, and a channel region 102c disposed therebetween. Where the active layer 102 includes amorphous silicon or polycrystalline silicon, the source region 102a and the drain region 102b may be doped with impurities.

A gate insulating layer 103 is disposed on the active layer 102 and may have a single layer structure or a multiple layer structure including a layer including an inorganic material such as silicon oxide and/or silicon nitride. The gate insulating layer 103 may insulate the active layer 102 and the gate electrode 104 from each other.

The gate electrode 104 is disposed on the gate insulating layer 103. The gate electrode 104 is connected to a gate line (not shown) in the display area DA applying on/off signals to the TFT. The gate electrode 104 may include a relatively low electrical resistance metallic material, and for example, may have a single layer structure or a multiple layer structure including a layer including a conductive material including a material selected from molybdenum (Mo), aluminum (Al), copper (Cu) titanium (Ti) and a combination thereof.

An interlayer dielectric 105 is disposed on the gate electrode 104. The interlayer dielectric 105 may insulate the gate electrode 104, from the source electrode 106a and the drain electrode 106b. The interlayer dielectric 105 may have a single layer structure or a multiple layer structure including a layer including an inorganic material. In an embodiment, for example, the inorganic material may be metal oxide or metal nitride, and specifically, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$) or zirconium oxide ($ZrO_2$).

The source electrode 106a and the drain electrode 106b are disposed on the interlayer dielectric 105. In an embodiment, for example, the source electrode 106a and the drain electrode 106b may have a single layer structure or a multiple layer structure including a layer including a conductive material selected from Mo, Al, Cu Ti and a combination thereof. The source electrode 106a and the drain electrode 106b are respectively in contact with the source region 102a and the drain region 102b of the active layer 102 through contact holes defined in the interlayer dielectric 105 and the gate insulating layer 103.

NA planarization layer 107 is disposed to cover the TFT. The planarization layer 107 may eliminate a step height caused by the TFT and may planarize a top surface of the display area DA. Thus, the planarization layer 107 may reduce or effectively prevent the occurrence of defects in an organic light-emitting diode ("OLED") due to the unevenness under the planarization layer 107. The planarization layer 107 may have a single layer structure or a multiple layer structure including a layer including an inorganic material and/or an organic material. In an embodiment, for example, the inorganic material include metal oxide or metal nitride, and specifically, the inorganic material may include $SiO_2$, $SiN_x$, SiON, $Al_2O_3$, $TiO_2$, $Ta_2O_5$, $HfO_2$ or $ZrO_2$. The organic material may include a general-purpose polymer, such as polymethylmethacrylate ("PMMA") and polystyrene ("PS"), a phenol group-containing polymer derivative, an acrylic polymer, an imide-based polymer, an arylether-based polymer, an amide-based polymer, a fluorinated polymer, a p-xylene-based polymer, a vinylalcohol-based polymer, and a blend thereof. Also, the planarization layer 107 may have a composite stack structure including an inorganic insulating layer and an organic insulating layer.

The TFT is connected to the OLED. The OLED may emit light or may not emit light according to turn-on state or turn-off state of the TFT. In FIG. 3, the flexible display apparatus 1 operated as an active type is disclosed. However, an embodiment of the invention may be used in a passive type operation in which a TFT is not included, and a layer having a TFT array disposed thereon is omitted.

The OLED is disposed on the planarization layer 107. Specifically, the OLED includes a pixel electrode 111, a counter electrode 112 opposite thereto, and an intermediate layer 113 disposed between two electrodes. A display apparatus may be classified as a bottom emission type, a top emission type or a dual emission type, according to an emission direction of the OLED. The pixel electrode 111 is included as a light-transmitting electrode and the counter electrode 112 is included as a reflective electrode in the bottom emission type. In the top emission type, the pixel electrode 111 is included as a reflective electrode and the counter electrode 112 is included as a transflective electrode. In the dual emission type, both the pixel electrode 111 and the counter electrode 112 are included as light-transmitting electrodes. FIG. 3 illustrates that the organic light-emitting display apparatus is a top emission type.

The pixel electrode 111 may be patterned in the form of a discrete island respectively corresponding to a pixel among a plurality of pixels of the flexible display panel 100. Also, the pixel electrode 111 may be in contact with the TFT, which is included in the pixel circuit, through a hole defined in the planarization layer 107. Although not illustrated in FIG. 3, the pixel electrode 111 may be disposed to overlap the TFT in order to cover the pixel circuit under the pixel electrode 111.

The pixel electrode 111 may include a reflective electrode layer in addition to a transparent electrode layer in order for the light to be reflected in a direction of the counter electrode 112. When the pixel electrode 111 functions as an anode, the transparent electrode layer may include at least one selected from transparent conductive oxides with a high work function, such as indium tin oxide ("ITO"), indium zinc oxide ("IZO"), zinc oxide ("ZnO"), indium oxide ("$In_2O_3$"), indium gallium oxide ("IGO"), and aluminum zinc oxide ("AZO"). The reflective electrode layer may include a high reflective metal such as silver (Ag).

A pixel-defining layer 109 is disposed on the planarization layer 107. The pixel-defining layer 109 may include one or more organic insulating materials selected from polyimide, polyamide, acryl resin, benzocyclobutane and phenol resin, such as by using a method such as spin coating in the manufacturing method of the display area DA. An opening 190a may be defined in the pixel-defining layer 109 which covers edges of the pixel electrodes 111, and exposes at least the center of the pixel electrode 111. A region limited to the opening 109a corresponds to a pixel, for example, a light-emitting region of the pixel, and the intermediate layer 113 is disposed in the opening 109a.

The intermediate layer 113 includes an organic emission layer configured to emit red, green or blue light, and a low molecular weight organic material or a polymer organic material may be used to form the organic emission layer. Where the organic emission layer is a low molecular weight organic layer including the low molecular weight organic material, a hole transport layer ("HTL") and a hole injection layer ("HIL") may be disposed in a direction of the pixel electrode 111 with respect to the organic emission layer, and an electron transport layer ("ETL") and an electron injection layer ("EIL") may be stacked in a direction of the counter electrode 112. In an embodiment, various layers, in addition to the HIL, the HTL, the ETL and the EIL, may be stacked and formed.

In the above-described embodiment, a separate organic emission layer is disposed for each pixel is illustrated as an example. Each pixel may emit red, green or blue light. However, the invention is not limited thereto. The organic emission layer may be commonly disposed on a plurality of pixels disposed in the display area DA. In an embodiment, for example, the plurality of organic emission layers that emit red, green and blue light may be vertically stacked instead of adjacent in a plan view, or mixed to emit white light. However, a combination of colors to emit the white light is not limited thereto. In an embodiment, a color conversion layer for converting the emitted white light into predetermined color or a color filter may be separately included.

The counter electrode 112 is disposed to cover the entire pixel-defining layer 109. The counter electrode 112 may include a conductive inorganic material. When the counter electrode 112 functions as a cathode, the counter electrode 112 may include a material with a low work function, such as lithium (Li), calcium (Ca), LiF/Ca, LiF/Al, Al, magnesium (Mg), and Ag. These metals may be formed as thin films so that the light may be transmitted therethrough.

The counter electrode 112 may be disposed to function as a common electrode over the entire display area DA in which an image is realized. In an embodiment of the manufacturing method of the display area DA, the counter electrode 112 may be formed by an evaporation process that does not damage the intermediate layer 113. The polarities of the pixel electrode 111 and the counter electrode 112 may be reversed or opposite to each other.

An insulating capping layer 114 may be further disposed on the counter electrode 112. The insulating capping layer 114 may maintain a work function of the counter electrode 112 and may reduce or effectively prevent damage of the organic material included in the intermediate layer 113 when an encapsulation thin film 100b is formed by using a sputtering process or a plasma enhanced chemical vapor deposition ("PECVD") process in the manufacturing method of the display area DA. The insulating capping layer 114 is an optional configuration and may not be included.

The encapsulation thin film 100b is disposed on an entire of the flexible display substrate 100a to cover both the display area DA and the non-display area NDA. The encapsulation thin film 100b is configured to protect the OLED from external moisture or oxygen. The encapsulation thin film 100b may have a single layer structure or a multiple layer structure including a layer of an insulating inorganic material. In an embodiment, for example, the inorganic material may include metal oxide or metal nitride, and specifically, the inorganic material may include $SiO_2$, $SiN_x$, SiON, $Al_2O_3$, $TiO_2$, $Ta_2O_5$, $HfO_2$, or $ZrO_2$.

The encapsulation thin film 100b may have an encapsulation structure in which a thin film of an organic material and a thin film of an inorganic material are alternatingly stacked on the layer of an insulating inorganic material. The organic layer includes a polymer, and may have a single layer structure or a stacked layer structure including one of polyethylene terephthalate, polyimide, polycarbonate, epoxy, polyethylene polyacrylate and a combination thereof. An uppermost layer of the encapsulation structure that is exposed to outside the flexible display panel 100 may include an inorganic layer in order to reduce or effectively prevent the penetration of moisture into the OLED. The encapsulation structure may include a stacked structure, in which at least one organic layer is inserted between at least two inorganic layers. Also, the encapsulation structure may include a stacked structure, in which at least one inorganic layer is inserted between at least two organic layers.

In an embodiment, for example, the encapsulation structure may sequentially include a first inorganic layer, a first organic layer and a second inorganic layer taken from a top of the OLED. Also, the encapsulation structure may sequentially include a first inorganic layer, a first organic layer, a second inorganic layer, a second organic layer and a third inorganic layer taken from the top of the OLED. Also, the encapsulation structure may sequentially include a first inorganic layer, a first organic layer, a second inorganic layer, a second organic layer, a third inorganic layer, a third organic layer and a fourth inorganic layer taken from the top of the OLED. Herein, the first organic layer has a planar area that is smaller than that of the second inorganic layer. The second organic layer may also have a planar area that is smaller than that of the third inorganic layer. Also, the first organic layer is completely covered with the second inorganic layer, and the second organic layer may also be completely covered with the third inorganic layer.

According to an embodiment of the invention, since the flexible display panel 100 includes the flexible display substrate 100a and the encapsulation thin film 100b having flexibility, the flexible display panel 100 may be bendable, foldable and/or unfoldable.

Referring again to FIG. 2, a touch screen panel 200 is disposed on the flexible display panel 100. One side of the flexible display panel 100 from which the light is emitted and a back side of the touch screen panel 200 are bonded such as with an adhesive 151. The touch screen panel 200 and the flexible display panel 100 are electrically connected to each other.

Figure 4:
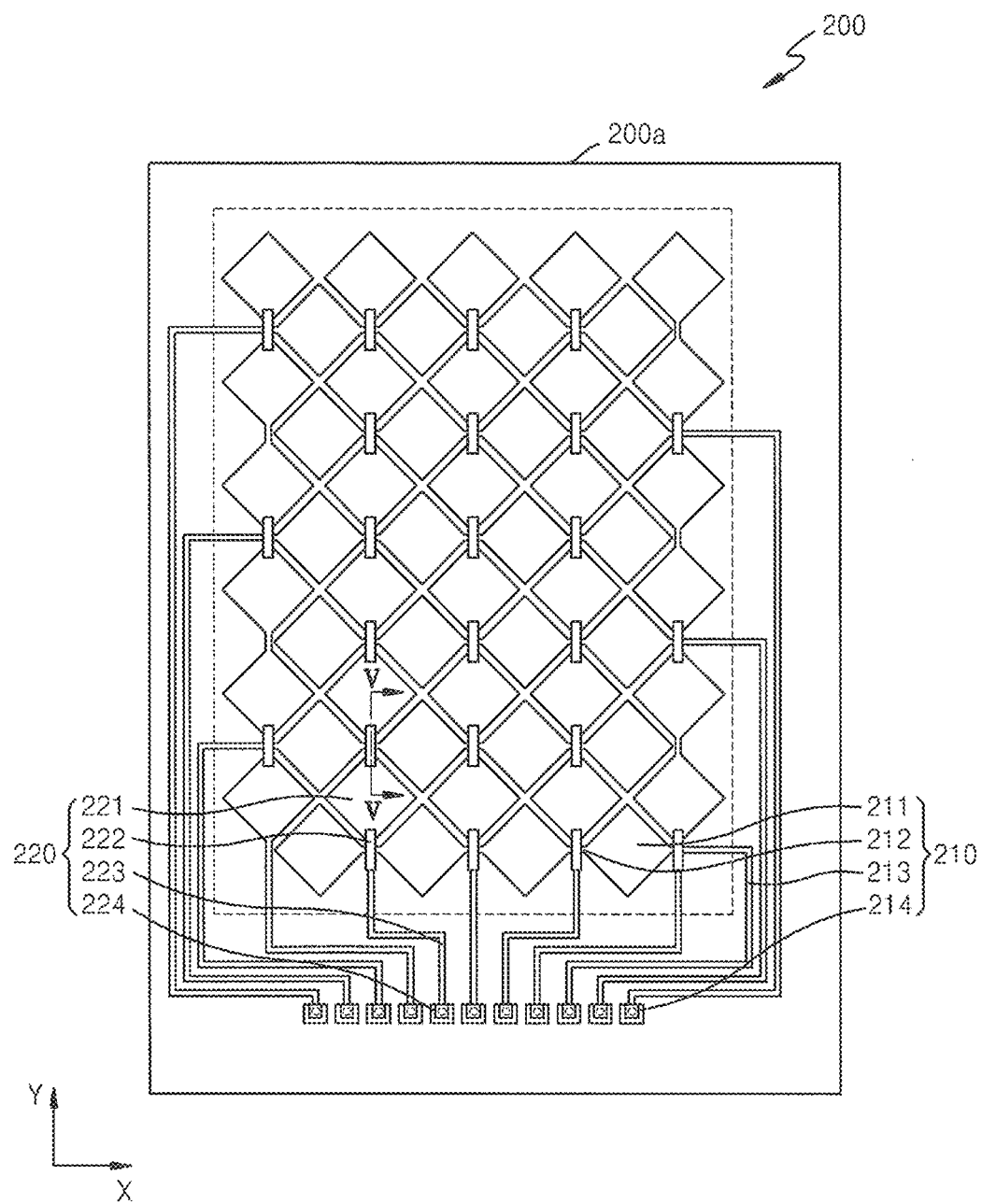
FIG. 4 is a schematic plan view illustrating an embodiment of a touch screen panel included in FIG. 2.
Figure 5:
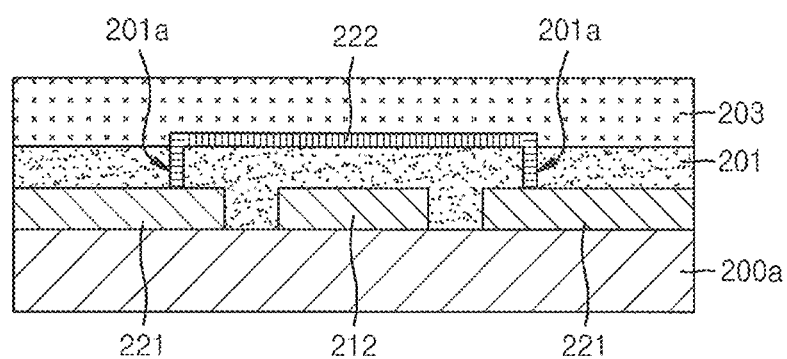
FIG. 5 is a cross-sectional view taken along line V-V of FIG. 4.

FIG. 4 is a schematic plan view illustrating an embodiment of the touch screen panel 200 included in FIG. 2, and FIG. 5 is a cross-sectional view taken along line V-V of FIG. 4. Both the specific configuration and manufacturing method of the touch screen panel 200 will be described with reference to FIGS. 4 and 5.

FIG. 4 illustrates the touch screen panel 200 that is operated by an electrical signal formed according to a user's touch. Although FIG. 4 illustrates the electrostatic capacitive type touch screen panel 200, it is only exemplary. According to an embodiment of the invention, the touch screen panel 200 may include a resistive type, an electro-magnetic type, a surface acoustic wave ("SAW") type or an infrared type.

In an embodiment of a manufacturing method of the touch screen panel 200, a flexible touch substrate 200a is prepared. Similar to the flexible display substrate 100a, a flexible material that is bendable or foldable may be used as the flexible touch substrate 200a.

A plurality of first electrode pattern units 210 and a plurality of second electrode pattern units 220 are alternatingly disposed on the flexible touch substrate 200a. The first electrode pattern units 210 are disposed side-by-side while corners thereof are facing each other along a first direction (X-direction) of the flexible touch substrate 200a. The second electrode pattern units 220 are disposed between a pair of adjacent first electrode pattern units 210. The second electrode pattern units 220 are disposed side-by-side while corners thereof are facing each other along a second direction (Y-direction) of the flexible touch substrate 200a.

The first electrode pattern units 210 respectively include a plurality of first body parts 211, a plurality of first connection parts 212, a plurality of first extension parts 213, and a plurality of first contact parts 214.

The first body parts 211 have a diamond shape in the plan view. The plurality of the first body parts 211 is serially disposed along the first direction (X direction) of the flexible touch substrate 200a. The first connection part 212 is disposed between a pair of the first body parts 211 that are adjacently disposed along the first direction (X direction). The first connection part 212 connects the pair of the first body parts 211 to each other. The first extension part 213 extends from one end of the first connection part 212. The first extension part 213 extends to an edge of the flexible touch substrate 200a and the plurality of first extension parts 213 are gathered on one side of the flexible touch substrate 200a. The first contact part 214 is disposed at one end of the first extension part 213.

The second electrode pattern units 220 respectively include a plurality of second body parts 221, a plurality of second connection parts 222, a plurality of second extension parts 223 and a plurality of second contact parts 224.

The second body parts 211 have a diamond shape in the plan view. The plurality of the second body parts 221 is serially disposed along the second direction (Y direction) of the flexible touch substrate 200a. The second connection part 222 connects the pair of the second body parts 221 to each other. The second extension part 223 extends from one end of the second connection part 222. The second extension part 223 extends to the edge of the flexible touch substrate 200a. The plurality of second extension parts 223 is gathered on the one side of the flexible touch substrate 200a. The second contact part 224 is disposed at one end of the second extension part 223.

With respect to the adjacently disposed pair of the first electrode pattern units 210, the pair of the first body parts 211 is connected to each other by the first connection part 212 that is coplanarly disposed. In contrast, with respect to an adjacently disposed pair of the second electrode pattern units 220, a pair of the second body parts 221 is connected to each other by the second connection part 222 that is disposed on a plane different from that of the first connection part 212, in order to avoid the interference with the first electrode pattern units 210.

Referring to FIG. 5, an insulating layer 201, which covers both the first electrode pattern units 210 and the second electrode pattern units 220, is disposed on the flexible touch substrate 200a. The insulating layer 201 may insulate the first electrode pattern units 210 and the second electrode pattern units 220 from each other.

Contact holes 201a are defined in the insulating layer 201 in regions corresponding to edge portions of the adjacently disposed pair of the second body parts 221 that face each other. The contact holes 201a are formed at regions in which the first electrode pattern parts 210 and the second electrode pattern parts 220 cross each other. The second connection part 222 is extended through the contact holes 201a and connects the pair of the second body parts 221 to each other across the insulating layer 201. According to the above configuration, a short circuit between the first electrode pattern part 210 and the second electrode pattern part 220 may be reduced or effectively prevented.

The first electrode pattern parts 210 and the second electrode pattern parts 220 may include a transparent layer, for example, a transparent material such as ITO, IZO, Nzo or $In_2O_3$.

Also, in an embodiment of a manufacturing method of the touch screen panel 200, the first electrode pattern parts 210 and the second electrode pattern parts 220 may be formed by a photolithography process. That is, the first electrode pattern parts 210 and the second electrode pattern parts 220 may be formed by patterning transparent conductive layers that are formed such as by deposition, spin coating, sputtering and ink-jet printing.

A protective layer 203 for covering the second connection parts 222, which connect the plurality of second electrode pattern parts 220, is disposed on the insulating layer 201.

When an input means, such as a finger or other object, is disposed near or in contact with the touch screen panel 200, the touch screen panel 200 having the above structure may detect a touch position by measuring electrostatic capacity that is changed between the first electrode pattern part 210 and the second electrode pattern part 220. According to an embodiment of the invention, since a flexible material is used as the flexible touch substrate 200a, the touch screen panel 200 may be easily bent or may be folded and unfolded within the flexible display apparatus 1.

Referring again to FIG. 2, the optical film 300 is disposed on the touch screen panel 200. A top of the touch screen panel 200 and a back side of the optical film 300 are bonded with an adhesive 151. Herein, the optical film 300 may be a circular polarization film or a linear polarization film, and may allow a user to easily observe an image by reducing or effectively preventing the reflection of external light.

The cover window 400 is disposed on the optical film 300.

A top of the optical film 300 and a back side of the cover window 400 are bonded with an adhesive layer 351. The adhesive layer 351 may have a cross-sectional thickness of a few micrometers (μm), for example, about 30 μm to about 70 μm. The adhesive layer 351 may include a relatively soft material having elasticity, for example, a silicon-based elastomer.

The cover window 400 may include a flexible material so that the flexible display apparatus 1 may be bent, folded and/or unfolded. However, the flexible material may be relatively easily damaged by external impact. In order to protect the cover window 400 from damage such as cracks and scratches, the cover window 400 may include a collective window film including a flexible material and a coating layer for protecting the window film from damage. However, since the adhesive layer 351 for bonding the cover window 400 to the top of the optical film 300 and having the above configuration includes a soft material having elasticity, surface hardness of the coating layer may be decreased. Specifically, where an external pressure is applied to the coating layer that is disposed on an outermost surface of the flexible display apparatus 1, a depression may occur commensurate with the pressure applied. Since the adhesive layer 351 under the cover window 400 includes a soft material having elasticity, the depression may occur commensurate with the thickness of the adhesive layer 351. In an embodiment, for example, where the cover window 400 is depressed as much as the total thickness of the adhesive layer 351, a surface of the coating layer may be significantly deformed and depression stains or scratches may occur in the coating layer.

Therefore, there remains a need to develop the cover window 400 for reducing or effectively preventing decrease in the surface hardness of the coating layer while not decreasing the bending, folding and/or unfolding of the flexible display apparatus 1.

According to an embodiment of the invention, the flexible display apparatus 1 that is resistant to external damage may be manufactured without impairing flexibility thereof by using the window film having a predetermined modulus of elasticity and adjusting a total cross-sectional thickness of the cover window 400.

Figure 6:
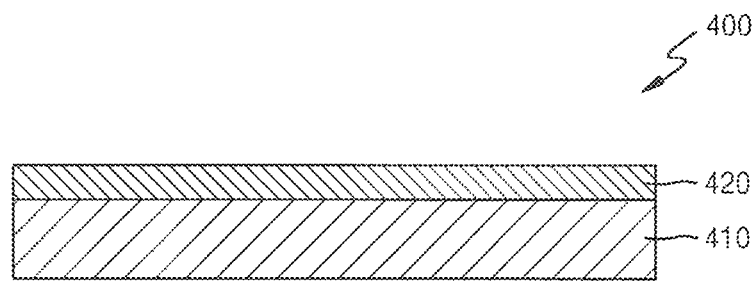
FIG. 6 is a schematic cross-sectional view illustrating an embodiment of a cover window according to the invention.

FIG. 6 is a schematic cross-sectional view illustrating an embodiment of the cover window 400 according to the invention. Referring to FIG. 6, the cover window 400 includes a window film 410 which is bonded to the optical film 300 by the adhesive layer 351, and a coating layer 420 disposed on the window film 410.

The window film 410 may include a transparent plastic film having a modulus of elasticity of about 6.3 gigapascals (GPa) or more. A material satisfying the above condition may include polyethylene terephthalate, polymethylmethacrylate, polycarbonate and polyimide. However, these materials are only exemplary and the material of the window film 410 is not limited thereto. In an embodiment, for example, the window film 410 may include polyimide and the polyimide may be transparent polyimide, which is not amber polyimide, in order for a user to view an image that is realized in the display area DA.

Although it will be described in detail with reference to FIGS. 8 and 9, the cover window 400 may satisfy the condition of high hardness when the window film 410 has a modulus of elasticity of about 6.3 GPa or more. Herein, the condition of high hardness, although it will be described in detail in FIG. 8, denotes a condition in which satisfies a pencil hardness of 8H or more in a pencil hardness test.

Figure 7:
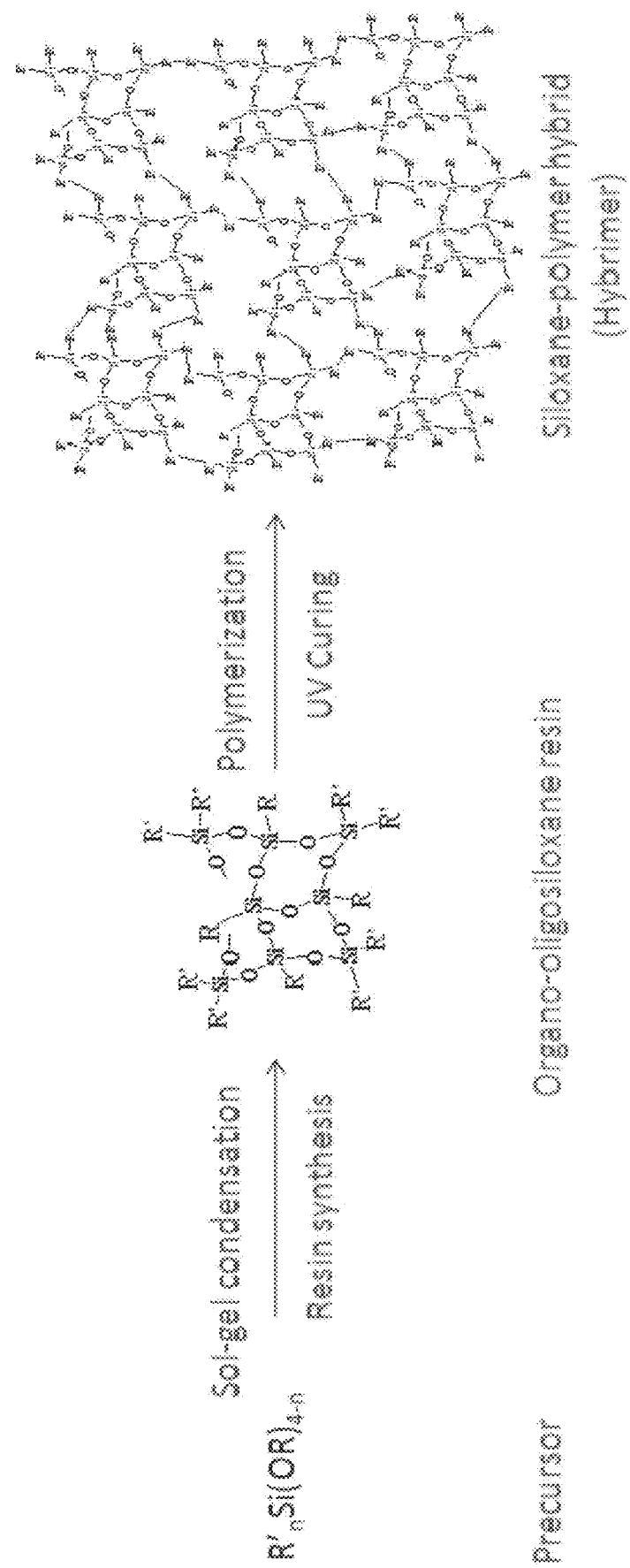
FIG. 7 is a schematic view illustrating an embodiment of a reaction process of a hybrimer, as a material used in a coating layer, according to an embodiment of the invention.

The coating layer 420 may include a hybrimer. FIG. 7 is a schematic view illustrating a reaction process of a hybrimer, as a material used in the coating layer 420, according to an embodiment of the invention.

Referring to FIG. 7, among hybrimers, an oligosiloxane hybrid formed by a sol-gel condensation reaction of organoalkoxysilane and organosilanediol, or a siloxane-polymer hybrid formed by the polymerization thereof, may be used as the coating layer 420.

As illustrated in FIG. 7, the oligosiloxane hybrid is prepared by a sol-gel reaction. Specifically, the oligosiloxane hybrid is formed by the condensation reaction of organoalkoxysilane and organosilanediol as shown in Reaction 1 below. A hydrolytic or non-hydrolytic sol-gel reaction process may be used as the sol-gel reaction.

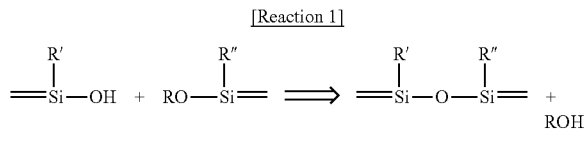

[Reaction 1]

As illustrated in Reaction 1, a condensation reaction between a hydroxyl group of the organosilanediol as a starting monomer and an alkoxy group of the organoalkoxysilane as another monomer is performed to form an inorganic network structure and an oligosiloxane hybrid modified with organic groups, such as R' and R", may be formed around the inorganic network structure. As illustrated in FIG. 7, the oligosiloxane hybrid becomes a siloxane-polymer hybrid by a polymerization process via ultraviolet (UV) curing.

A coating layer may be formed by coating the siloxane-polymer hybrid such as by a wet coating method, on the window film 410. Specifically, the window film 410 is coated with a mixed solution of an oligosiloxane hybrid and a volatile solvent. The mixed solution may include an oligosiloxane hybrid solid content of about 1 weight percent (wt %) or more based on the volatile solvent. The volatile solvent is removed by hot air drying the coated mixed solution. Thereafter, the oligosiloxane hybrid is polymerized by ultraviolet ("UV") light curing to form a siloxane-polymer hybrid. Herein, heat curing may also be used instead of the UV light curing. The polymerization process may be a primary crosslinking reaction. A coating layer is finally formed by performing a post-curing process. The post-curing process corresponds to a process of removing residual moisture using ultraviolet light or heat.

The total cross-sectional thickness of the cover window 400 is also related to whether the cover window 400 satisfies the condition of high hardness. According to an embodiment of the invention, the total cross-sectional thickness of the cover window 400 may be about 120 μm to satisfy the condition of high hardness. Experimental details will be described with reference to graphs of FIGS. 8 and 9. Where the cross-sectional thickness of the coating layer 420 is about 45% or more of the total thickness of the cover window 400, cracks or fatigue failures on the surface of the cover window 400 are not observed in pencil hardness tests or bending stiffness tests.

Figure 8:
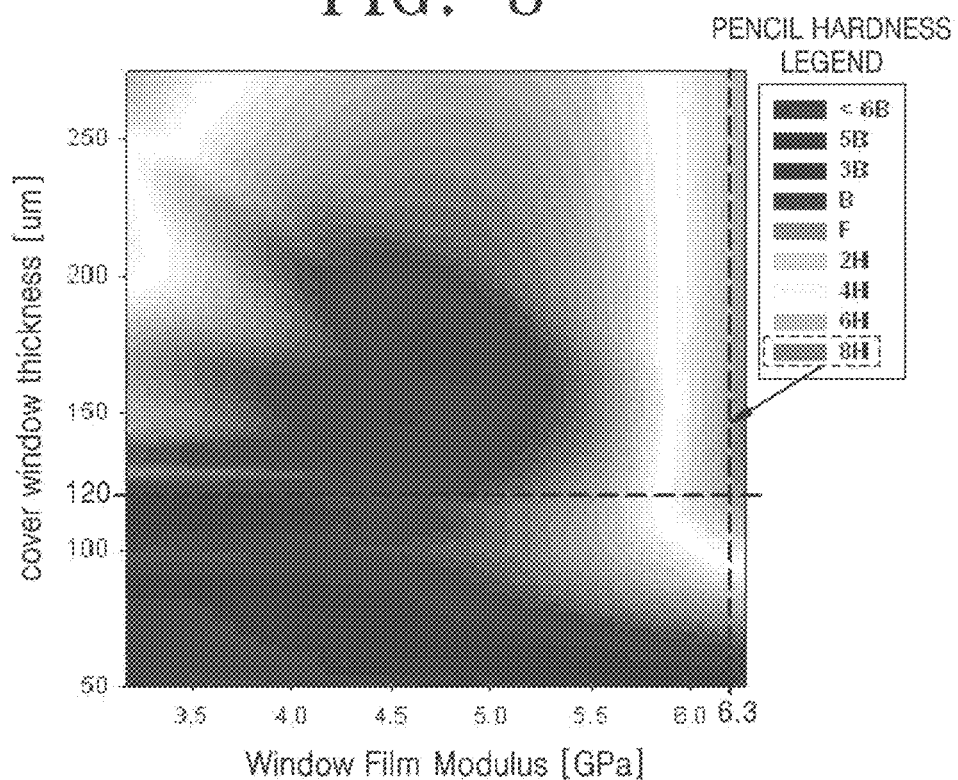
FIG. 8 illustrates the results of pencil hardness tests.

FIG. 8 illustrates the results of pencil hardness tests. In the pencil hardness test, the condition of high hardness is defined for a state in which depressions or scratches do not occur on the surface of the window cover 400 when a line is drawn about three times on the cover window 400 at a load of about 1 kilogram-force (kgf) with pencils having a hardness of 9B to 9H. The condition of high hardness, as the condition for being used in a product, may correspond to a pencil hardness of 8H or more. Thus, the cross-sectional thickness of the cover window 400 and the modulus of elasticity of the window film 410 which satisfy the condition of high hardness may be determined by the pencil hardness test.

According to the results of the tests in FIG. 8, it may be confirmed that pencil hardness values of about 8H or more are obtained when the thickness of the cover window 400 is about 120 μm or more and the modulus of elasticity of the window film 410 is about 6.3 GPa or more.

Figure 9:
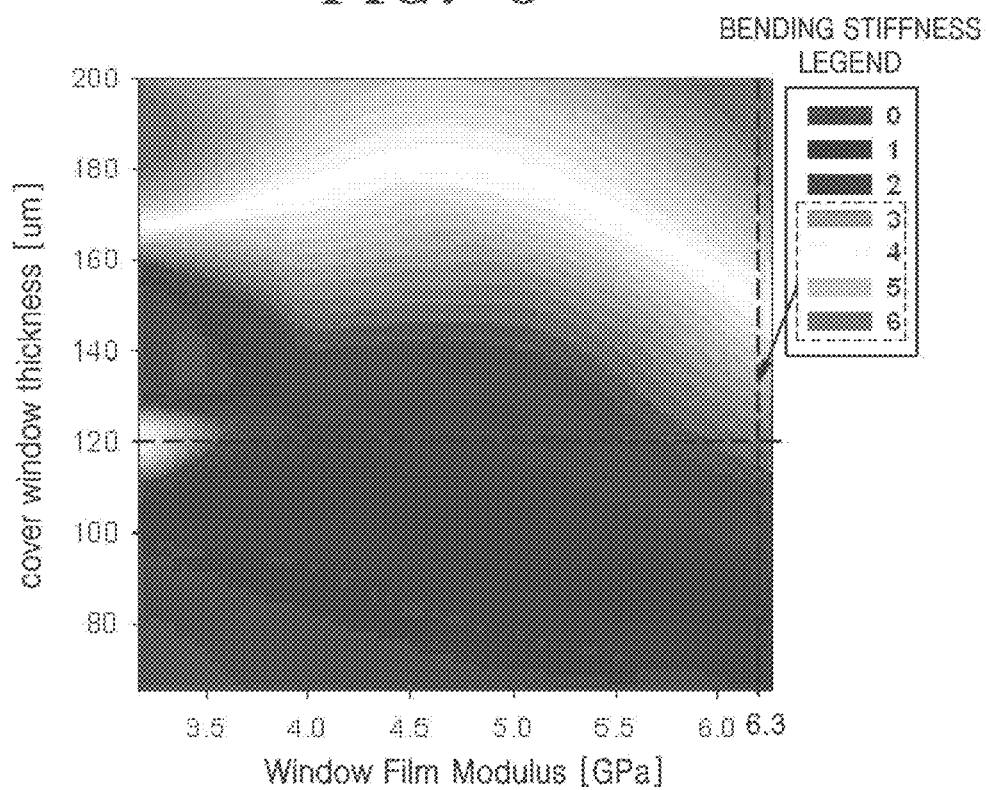
FIG. 9 illustrates the results of bending stiffness tests of a cover window.

FIG. 9 illustrates the results of bending stiffness tests of the cover window 400. In the bending stiffness test, a condition of high hardness is defined in a state in which cracks or fatigue failures do not occur on the surface of the cover window 400 when folding and unfolding of the flexible display apparatus 1 are repeatedly performed 200,000 times at a rate of about one in about 2 seconds using a jig. The condition of high hardness, as the condition for being used in a product, may correspond to a stiffness of about 3 or more.

As identified in FIG. 9, where the cross-sectional thickness of the cover window 400 is about 120 μm or more and the modulus of elasticity of the window film 410 is about 6.3 GPa or more, which is classified as the condition of high hardness in FIG. 8, most of the results of the bending stiffness tests also satisfy a stiffness of about 3 or more.

Referring to FIGS. 8 and 9, it may be evaluated that one or more embodiment of the cover window 400 according to the invention satisfies the condition of high hardness in both results of the pencil hardness tests and the bending stiffness tests.

As described above, according to one or more of the above-described embodiment of the invention, a flexible display apparatus is foldable and simultaneously has a surface that is resistant to external damage.

It should be understood that the embodiments described herein should be considered in a descriptive sense only and not for purposes of limitation. Descriptions of features within each embodiment should typically be considered as available for other similar features in other embodiments.

While one or more embodiment of the invention has been described with reference to the figures, it will be understood by those of ordinary skill in the art that various changes in form and details may be made therein without departing from the spirit and scope of the invention as defined by the following claims.

What is claimed is:
1. A flexible display apparatus comprising:
a flexible display panel comprising a display side on which an image is displayed;
a touch screen on the flexible display panel;
an optical film on the touch screen;
a cover window on the optical film, the cover window comprising:
a window film comprising polyimide; and
a coating layer on the window film;
a second layer between the touch screen and the optical film; and
a third layer between the optical film and the cover window,
the flexible display panel further comprising:
a flexible substrate comprising polyimide;
a buffer layer disposed on the flexible substrate and comprising an inorganic material;
a thin film transistor disposed on the flexible substrate;
an organic light-emitting diode electrically connected to the thin film transistor; and
an encapsulation layer disposed on the organic light-emitting diode and comprising a first inorganic layer, a first organic layer, and a second inorganic layer,
wherein the display side comprises portions facing each other in a folded state of the flexible display apparatus.

2. The flexible display apparatus of claim 1,
wherein the first inorganic layer and the second inorganic layer each comprise at least one of silicon nitride and silicon oxynitride.

3. The flexible display apparatus of claim 2,
wherein the buffer layer comprises a first buffer layer comprising silicon oxide and a second buffer layer comprising silicon nitride.

4. The flexible display apparatus of claim 1, wherein the flexible display apparatus further comprises:
a first layer between the flexible display panel and the touch screen.

5. The flexible display apparatus of claim 1,
wherein a thickness of the third layer is no less than 30 μm and no greater than 70 μm.

6. A flexible display apparatus comprising:
a flexible display panel comprising a display side on which an image is displayed;
a touch screen disposed on the flexible display panel;
an optical film disposed on the touch screen;
a cover window disposed on the optical film, the cover window comprising:
a window film comprising polyimide; and
a coating layer disposed on the window film;
a first adhesive layer between the touch screen and the optical film; and
a second adhesive layer between the optical film and the cover window,
the flexible display panel further comprising:
a flexible substrate comprising polyimide;
a thin film transistor disposed on the flexible substrate;
an organic light-emitting diode electrically connected to the thin film transistor; and
an encapsulation layer disposed on the organic light-emitting diode and comprising a first inorganic layer, a first organic layer, and a second inorganic layer,
the touch screen comprising:
an insulation layer;
a first electrode and a second electrode disposed on the insulation layer; and
a protective layer disposed on the first electrode and the second electrode,
wherein the second electrode comprises a plurality of body patterns and coupling patterns coupling adjacent body patterns,
wherein the first electrode and the body patterns are disposed on the same layer, and
wherein the body patterns and the coupling patterns are disposed on different layers, and
wherein the display side comprises portions facing each other in a folded state of the flexible display apparatus.

7. The flexible display apparatus of claim 6,
wherein the first inorganic layer and the second inorganic layer each comprise at least one of silicon nitride and silicon oxynitride.

8. The flexible display apparatus of claim 6, the flexible display panel further comprising:
a buffer layer disposed between the flexible substrate and the thin film transistor,
wherein the buffer layer comprises a first buffer layer comprising silicon oxide and a second buffer layer comprising silicon nitride.

9. The flexible display apparatus of claim 6,
wherein a thickness of the second adhesive layer is no less than 30 μm and no greater than 70 μm.

10. A flexible display apparatus comprising:
a flexible display panel comprising a display side on which an image is displayed;
a touch screen on the flexible display panel;
an optical film on the touch screen;
a cover window on the optical film, the cover window comprising:
a window film comprising polyimide; and
a coating layer on the window film;
a first adhesive layer between the touch screen and the optical film; and
a second adhesive layer between the optical film and the cover window,
the flexible display panel further comprising:
a flexible substrate comprising polyimide;
a buffer layer disposed on the flexible substrate and comprising a multiple layer;
a thin film transistor disposed on the flexible substrate;
an organic light-emitting diode electrically connected to the thin film transistor; and
an encapsulation layer disposed on the organic light-emitting diode and comprising a first inorganic layer, a first organic layer, and a second inorganic layer,
wherein the buffer layer comprises a first buffer layer comprising silicon oxide and a second buffer layer comprising silicon nitride,
wherein a thickness of the second adhesive layer is no less than 30 μm and no greater than 70 μm, and
wherein the display side comprises portions facing each other in a folded state of the flexible display apparatus.

11. The flexible display apparatus of claim 10,
wherein the first inorganic layer and the second inorganic layer each comprise at least one of silicon nitride and silicon oxynitride.

12. A flexible display apparatus comprising:
a flexible display panel comprising a display side on which an image is displayed;
a touch screen disposed on the flexible display panel;
an optical film disposed on the touch screen;
a cover window disposed on the optical film, the cover window comprising:
a window film comprising polyimide; and
a coating layer disposed on the window film;
a first adhesive layer between the touch screen and the optical film; and
a second adhesive layer between the optical film and the cover window,
the flexible display panel further comprising:
a flexible substrate comprising polyimide;
a buffer layer disposed on the flexible substrate and comprising a multiple layer;
a thin film transistor disposed on the flexible substrate;
an organic light-emitting diode electrically connected to the thin film transistor; and
an encapsulation layer disposed on the organic light-emitting diode and comprising a first inorganic layer, a first organic layer, and a second inorganic layer,
wherein a thickness of the coating layer is 45% or more of a thicknesses of the cover window.

13. The flexible display apparatus of claim 12,
wherein the optical film comprises a polarization film.

* * * * *